United States Patent [19]
Baek et al.

[11] Patent Number: 5,856,206
[45] Date of Patent: Jan. 5, 1999

[54] METHOD FOR FABRICATING BRAGG REFLECTOR USING IN SITU LASER REFLECTOMETRY

[75] Inventors: Jong-Hyeob Baek; Bun Lee, both of Daejeon, Rep. of Korea

[73] Assignee: Electronics and Telecommunications Research Institute, Daejeon, Rep. of Korea

[21] Appl. No.: 842,871

[22] Filed: Apr. 17, 1997

[30] Foreign Application Priority Data

Dec. 21, 1996 [KR] Rep. of Korea ...................... 96-69402

[51] Int. Cl.$^6$ .................................................. C23C 14/00
[52] U.S. Cl. ................. 438/32; 438/29; 118/715
[58] Field of Search ........................ 438/29, 32; 118/715

[56] References Cited

U.S. PATENT DOCUMENTS 5,472,505  12/1995  Lee et al. ................................ 118/715

OTHER PUBLICATIONS

Frateschi et al., "In Situ LaserReflectometry Applied to the Growth of AlXGa1–xAs Bragg Reflectors by Metalorganic Chemical Vapor Deposition", Electronics Letters, vol. 27, No. 2, pp. 155–157, Jan. 17, 1991.

D. G. Deppe, et al. *AlGaAs–GaAs and AlGaAs–GaAs–InGaAs vertical cavity surface emitting lasers with Ag mirrors*, J. Appl. Phys., vol. 66, No. 11, pp. 5629–5631, Dec. 1, 1989.

Frateschi, N.C., et al., *In situ laser reflectometry applied to the growth of $Al_xGa_{1-x}As$ bragg reflectors by metalorganic chemical vapour deposition*, Electronics Letters, vol. 27, No. 2, pp. 155–157, Jan. 17, 1991.

Gourley, P.L., et al. *Epitaxial surface–emitting laser on a lattice–mismatched substrate*, Appl. Phys. Lett., vol. 60, No. 17, pp. 2057–2059, Apr. 27, 1992.

Koyama, F., et al. *GaAlAs/GaAs MOCVD growth for surface emitting laser*, Japanese Journal of Applied Physics, vol. 26, No. 7, pp. 1077–1081, Jul., 1987.

*Primary Examiner*—Charles Bowers
*Assistant Examiner*—Keith Christianson
*Attorney, Agent, or Firm*—Cohen, Pontani, Lieberman & pavane

[57] ABSTRACT

A Bragg reflector with a uniform thickness is fabricated by means of an in-situ laser reflectometer. In order to fabricate the Bragg reflector, a plurality of buffer layers are formed on a semiconductor substrate. Then, first and second epitaxial layers are alternatively grown on the buffer layers. While growing the epitaxial layers, the thickness of the first and second epitaxial layers are continuously measured by using a laser beam having the same wavelength as a reflective wavelength of the Bragg reflector. In this way, the thickness of the Bragg reflector is precisely controlled according to the measurements, so that the Bragg reflector may be fabricated uniformly with a predetermined thickness.

4 Claims, 2 Drawing Sheets

METHOD FOR FABRICATING BRAGG REFLECTOR USING IN SITU LASER REFLECTOMETRY

BACKGROUND OF THE INVENTION

1. Field of the Invention

The present invention relates to a surface emitting laser, and more particularly a method for fabricating a Bragg reflector with a uniform thickness in which the thickness of a growing epitaxial layer is effectively controllable by means of an in-situ laser reflectometer which employs a laser beam having the same wavelength as that of the Bragg reflector to be fabricated.

2. Description of the Related Art

Metal-organic chemical vapor deposition (hereinafter, referred to as MOCVD) which is a common method for growing a semiconductor multilayer structure has been widely used for growing an epitaxial layer with an electron and photon structure on a GaAs or InP substrate.

Unlike a conventional laser diode which generates the laser beam at the sides, a recently developed surface emitting laser (hereinafter, referred to as SEL) generates the laser beam at the surface. It is well known that such a SEL has the advantages of a low threshold current and a high emitting efficiency. It is therefore expected that the SEL will become a promising laser emitting device in the future. In general, the performance of the SEL is mainly dependent upon the uniformity of thickness of a Bragg reflector which is employed as a basic structure of the SEL. Further, it is preferred that the Bragg reflector should be designed to have a thickness equal to a quarter of the desired wavelength in order to obtain the maximum reflectivity. Conventionally, however, such Bragg reflector has been grown by using an epitaxial growing device which can not precisely control the thickness of the growing epitaxial layer.

According to a known method for fabricating the Bragg reflector, while a single layer is being grown by using raw materials for the Bragg reflector, a thickness of the growing layer is measured by means of an electron microscope to evaluate therefrom a growing speed. Then, in accordance with the evaluated growing speed, the growing time corresponding to the desired thickness of the Bragg reflector is determined. However, since the growing system does not have completely reproducible characteristics due to the variation of the growing condition depending on the materials, it is difficult to grow the Bragg reflector with a uniform thickness. According to another known method for fabricating the Bragg reflector, a refractive index is first evaluated by using a real time laser beam analyzer and then, a growing speed of the Bragg reflector is determined during the growing process based on the evaluated retractive index. Then, in accordance with the growing speed, the thickness of the growing Bragg reflector is controlled. However, since this known method uses the refractive index in order to evaluate the growing speed, it is necessary to previously know the retractive index of the epitaxial layer. Therefore, it may not be possible to precisely grow Bragg reflector in real time without knowing the refractive index previously.

SUMMARY OF THE INVENTION

It is therefore an object of the present invention to provide a method for evaluating a thickness of a growing epitaxial layer in real time, using a laser beam having the same wavelength as that of a Bragg reflector to be fabricated, so as to grow the Bragg reflector with a uniform thickness.

According to an aspect of the present invention, a method for fabricating a Bragg reflector using an in-situ laser reflectometer, includes the steps of: forming a plurality of buffer layers on a semiconductor substrate; growing first and second epitaxial layers alternatively on the buffer layers, the first epitaxial layer being a InAlGaAs layer, the second epitaxial layer being a InAlAs epitaxial layer; and measuring a thickness of the first and second epitaxial layers by using a laser beam having a same wavelength as a reflective wavelength of the Bragg reflector to be fabricated; whereby the thickness of the Bragg reflector is controlled according to the measurements, so as to grow the Bragg reflector uniformly with a predetermined thickness. Here, the Bragg reflector is grown for a quarter of a cycle time of the buffer layer.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

An embodiment of the present invention will be described in detail hereinbelow with reference to the attached drawings.

Figure 1:
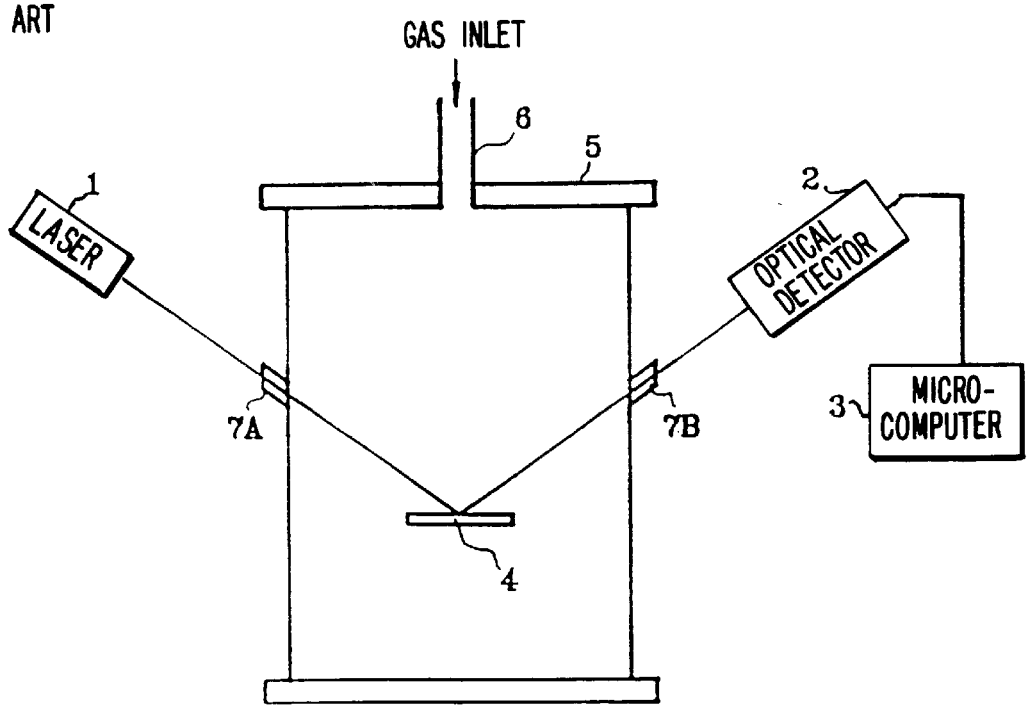
FIG. 1 is a schematic diagram showing a known in-situ laser reflectometer.

Referring to FIG. 1, there is illustrated a known in-situ laser reflectometer mounted on a growing chamber 5. The in-situ laser reflectometer includes a laser beam generator 1 for generating laser beams, an optical detector 2 for detecting the laser beams, and a microcomputer 3 connected to an output of the optical detector 2. Further, the growing chamber 5 for growing a semiconductor multilayer structure includes a gas infusing inlet 6 mounted at the top thereof for infusing material gases, and windows 7A and 7B formed at the opposite sides thereof through which the laser beams pass. Specifically, the laser beam generator 1 generates two laser beams having different wavelengths according to the present invention. The laser beams are irradiated into the growing chamber 5 through the window 7A and reflected on a substrate 4 (more specifically, an epitaxial layer being grown on the substrate 4) mounted at a lower part of the growing chamber 5. The optical detector 2 detects the reflected laser beams and converts it into an electrical signal. The microcomputer 3 receives the output signal from the optical detector 2 to evaluate therefrom a thickness of a Bragg reflector being grown on the substrate 4.

In operation, raw material gases are infused into the growing chamber 5 in turn through the gas infusing inlet 6 and reach the substrate 4 that has been previously heated. Then, the infused material gases undergoes a chemical reaction, thereby resulting into a growth of the solid state semiconductor multilayer. Such a process is called MOCVD (metal-organic chemical vapor deposition). While the semiconductor multilayer is being grown, the in-situ laser reflectometer mounted at the outside of the growing chamber 5 analyzes the thickness and composite of the growing multilayer on real time basis. The laser beams used in the application are a He-Ne laser beam and a diode laser beam; the He-Ne laser beam has a wavelength of 0.6328 µm and the diode laser beam has a wavelength of 1.5 µm. It should be noted that the diode laser beam having the wavelength of 1.5 µm is selectively used so as to form a reflective region at the same wavelength as a reflective wavelength (=1.5 µm) of the Bragg reflector. Further, the He—Ne laser beam having the wavelength of 0.6328 µm serves as an auxiliary means for accurately controlling the growing thickness, while growing the Bragg reflector. It can be clearly appreciated that if it is desired to fabricate a Bragg reflector having a different reflective wavelength, a new laser beam having the same wavelength as the desired reflective wavelength of the Bragg reflector should be selected. The He—Ne and diode laser beams are irradiated simultaneously to the growing Bragg reflector on the substrate 4 through the window 7A of the growing chamber 5. The laser beams are reflected on the growing Bragg reflector and detected by the optical detector 2 through the opposite window 7B. The detected laser beams are converted at the optical detector 2 into an electric signal to be applied to the microcomputer 3.

Figure 2:
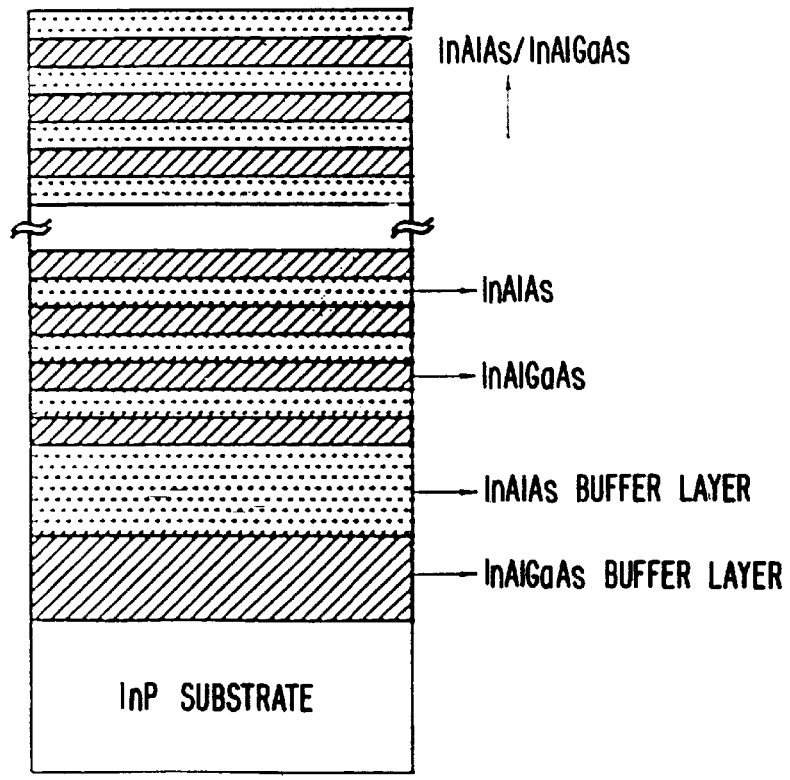
FIG. 2 is a cross sectional view of a Bragg reflector fabricated according to an embodiment of the present invention.
Figure 3:
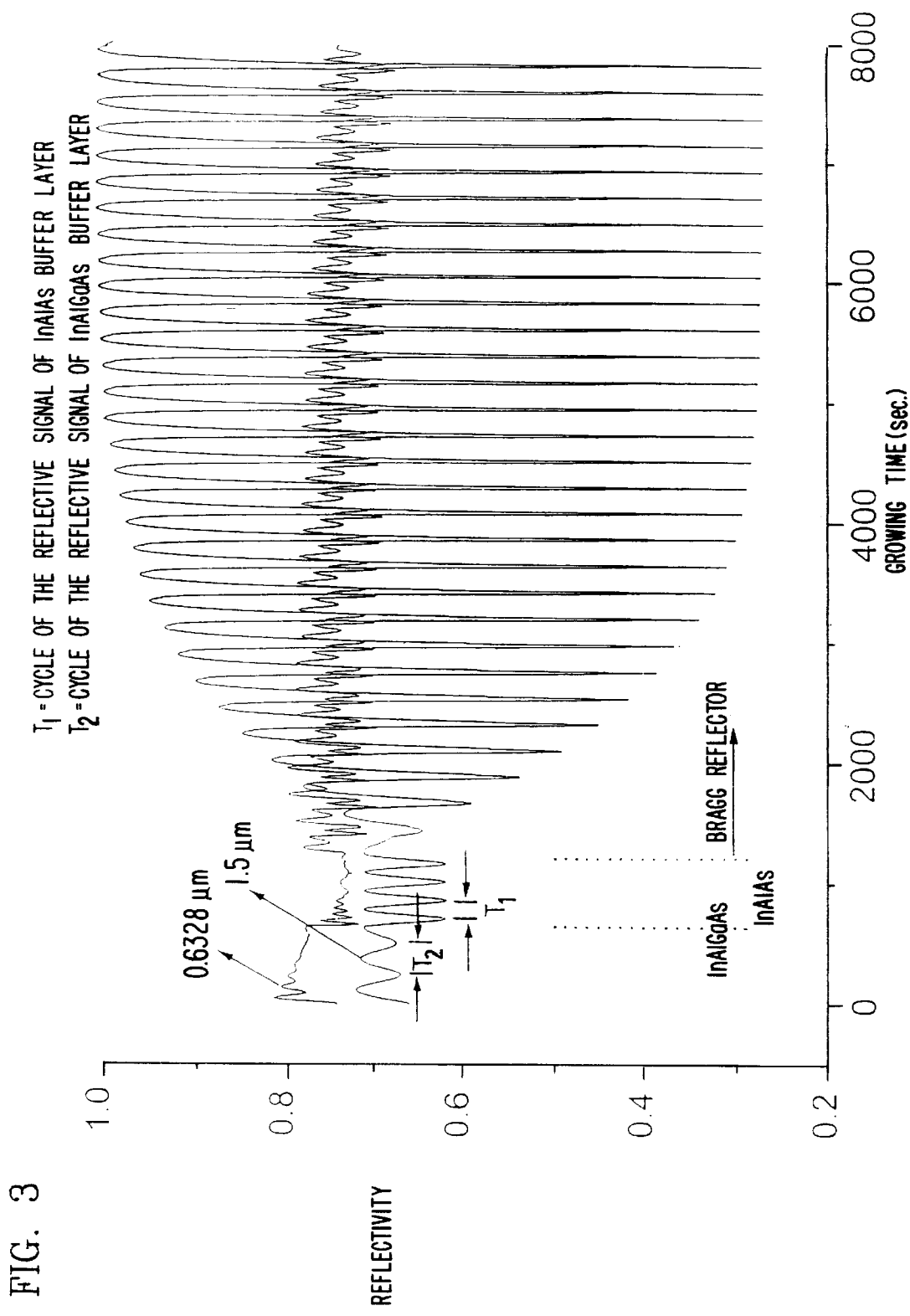
FIG. 3 is a curve showing characteristics of the reflectivity of the Bragg reflector according to the present invention.

The embodiment of the present invention will now be described in detail with reference to FIGS. 2 and 3, in which FIG. 2 illustrates a cross sectional view of the Bragg reflector according to an embodiment of the present invention, and FIG. 3 illustrates a curve showing characteristics of the reflectivity of the Bragg reflector.

Referring to the drawings, the Bragg reflector which is commonly used as a basic structure of the surface emitting laser (SEL) or an optical modulator is designed to have a thickness corresponding to a quarter of the desired wavelength. As illustrated in FIG. 3, the reflectivity of the laser beams reflected on the Bragg reflector during its growth are changed according to the growing time. The reflectivity of the He—Ne laser beam with the wavelength of 0.6328 µm and the diode laser beam with the wavelength of 1.5 µm are measured by the optical detector 2 in real time while growing the Bragg reflector and then, converted into reflective signals.

In summary, the in-situ laser reflectometer shown in FIG. 1 measures a thickness of an epitaxial layer in real time while growing the epitaxial layer with the Bragg structure shown in FIG. 2. Then, the reflective signals of the laser beams generated from the optical detector 2, which are a function of the growing time, can be obtained as shown in FIG. 3. For the convenience of explanation, it is assumed that the growing epitaxial layer is a InAlGaAs/InAlAs Bragg reflector of 30 layers altering InAlGaAs and InAlAs. Here, it should be noted that the InAlGaAs and InAlAs materials are selected for the epitaxial layer because they have appropriate refractive indices for reflecting the laser beams at the wavelength of 1.5 µm. It should be further noted that shorter wavelength materials such as GaAs and AlGaAs may be selected for the epitaxial layer, if it is desired to employ the Bragg reflector with different wavelength. In the application, however, description will be given to the Bragg reflector with the wavelength of 1.5 µm, which is widely used for an optical communication.

Referring to FIG. 2, InAlGaAs and InAlAs buffer layers are formed with the same materials under the Bragg reflector in order to previously determine a growing cycle of the materials. If it is assumed that the cycle of the reflective signal of the buffer layer is T and the wavelength of the laser beam to be measured is λ, the cycle T is represented by:

$$T = \lambda/2nG$$

where "n" represents an effective refractive index of the growing epitaxial layer and "G" represents the growing speed of the epitaxial layer. While the epitaxial layer is being grown, the laser beam generator 1 generates the He—Ne and diode laser beams to irradiate the growing epitaxial layer on the substrate 4 through the window 7A. Then, the laser beams partially reflects on the surface of the growing epitaxial layer, and partially penetrates through the growing epitaxial layer to reach the substrate 4. The laser beam reflected on the epitaxial layer is applied to the optical detector 2. Further, the laser beam that has reached the substrate 4 is also reflected to be applied to the optical detector 2. Therefore, the laser beam reflected on the surface of the epitaxial layer and the other laser beam reflected on the substrate 4 have a path difference, causing an interference due to the phase difference in accordance with the law of physics. In the meanwhile, if the phase difference becomes minimized (i.e., the same phase) as the epitaxial layer increases in thickness, the interference is reinforced. At this moment, the intensity of the reflected laser beam become the maximum. On the contrary, if the phase difference becomes maximized (i.e., 180 degree phase difference) as the epitaxial layer continuously increases in thickness, the interference is countervailed. At this moment, the intensity of the reflected laser beam becomes minimized. As the result, the optical detector 2 generates a periodic reflective signal swinging between the maximum and minimum intensities, as the epitaxial layer grows on continuously. Of course, the actual periodic reflective signal generated from the optical detector 2 is more complicated because the second and third reflections and penetrations are again caused internally. In any event, the reflective signal based on the interferences becomes periodic. Here, since one cycle of the laser beam reflective signal of the buffer layer corresponds to the half wavelength of the Bragg reflective wavelength, the quarter wavelength of the Bragg reflective wavelength corresponds to a half cycle of the laser beam reflective signal. In other words, the half cycle time of the laser beam reflective signal of the buffer layer is identical to the time required for growing the epitaxial layer as thick as a quarter wavelength of the Bragg reflective wavelength.

In this case, since λ which is the reflective wavelength of the used laser beam corresponds to the Bragg reflective wavelength, the wavelength of the laser beam should be changed according to the desired Bragg reflective wavelength. The epitaxial layer is grown at a high temperature and the half cycle is measured at the same temperature. Therefore, the Bragg reflective wavelength at the room temperature may cause a slight variation due to the temperature difference which causes a difference of the refractive index. However, according to an experiment, the difference is measured to be less than 2% and this can be corrected previously by way of an experiment.

Upon completion of growing the buffer layer, the Bragg reflector can be grown by taking the evaluated half cycle time for the growing time. In this manner, the whole reflective signals of 30 cycles can be obtained as shown in FIG. 3. Moreover, it can be understood from FIG. 3 that the reflectivity increases more and more, as the growing process for the Bragg reflector is repeated. This is because that the Bragg reflector is designed to become identical to the measured laser beam and the reflective signal at the designed wavelength region is amplified as the Bragg cycle increases more and more. In this way, it is possible to check as to whether or not the thickness of the Bragg reflector is accurately coincident with the measured wavelength.

In the meantime, in the case where the reflective signal by means of the laser beam with the wavelength of 1.5 μm reaches the maximum point during growing the first InAlGaAs epitaxial layer directly without previously forming the buffer layers, the time at which the reflective signal reaches the maximum point is coincident with a time point corresponding to a quarter of the reflective wavelength of 1.5μm. Thus, at this time point, growing the InAlGaAs epitaxial layer is completed and the InAlAs epitaxial layer is continuously grown. Since the InAlAs epitaxial layer has a refractive index lower than that of the InAlGaAs epitaxial layer, the reflective signal begins to decrease and reaches the minimum point after lapsing a predetermined time. At this time, since the thickness of the InAlAs epitaxial layer is coincident with a quarter of the reflective wavelength of 1.5 μm, growing the InAlAs epitaxial layer is completed and the InAlGaAs epitaxial layer is continuously grown. By repeating the above growing process, it may be possible to grow the Bragg reflector having the maximum reflectivity at the wavelength of 1.5 μm. The time point at which the reflective signal become the maximum and minimum can not be known previously, since the whole reflectivity for the wavelength of 1.5 μm increases more and more. Thus, the laser beam with the different wavelength is used as an auxiliary means. Namely, as shown in FIG. 3, if using the He—Ne laser beam with the wavelength of 0.6328 μm which is located far from the diode laser beam with the wavelength of 1.5 μm, the whole reflective signal is almost not changed while growing the Bragg reflector. Thus, when the reflectivity of the 1.5 μm diode laser beam become the maximum, the reflectivity and the cycle of the 0.6328 μm He—Ne laser beam are measured. As the result of the measurement, if the reflectivity and the cycle of the 0.6328 μm laser beam have the same value, it is determined that the 1.5 μm laser beam become the maximum or minimum.

As described theretofore, the present invention continuously measures the thickness of the growing epitaxial layer by means of the in-situ laser reflectometer which employs a laser beam having the same wavelength as that of the Bragg reflector to be fabricated. Therefore, it is not necessary to previously know the refractive index of the material of the Bragg reflector. As the result, it is possible to grow the Bragg refractive in real time without previously knowing the reflective index for the unknown material of the Bragg reflector. Accordingly, the present invention may grow the Bragg reflector with a uniform thickness by using a semiconductor material of which refractive index is not known. Furthermore, since it is not necessary to measure the reflective index and the growing speed of the material, the present invention may save time and cost.

What is claimed is:

1. A method for fabricating a Bragg reflector having a reflective wavelength using an in-situ laser reflectometer, comprising the steps of:

providing a laser beam having a wavelength substantially equal to the reflective wavelength of the Bragg reflector to be fabricated;

forming a plurality of buffer layers on a semiconductor substrate;

irradiating the semiconductor substrate with the laser beam while the plurality of buffer layers are being formed thereon so as to generate a reflected beam having at least one cycle period;

growing first and second epitaxial layers alternatively on said buffer layers ; and measuring a thickness of the first and second epitaxial layers by comparing a growth interval of the first and second epitaxial layers with one half of the at least one cycle period of the reflected beam, so as to grow the Bragg reflector uniformly to a predetermined thickness.

2. A method for fabricating a Bragg reflector according to claim 1, wherein said Bragg reflector is grown for a quarter of a cycle time of the buffer layer.

3. The method of claim 1, wherein the predetermined thickness of the first and second epitaxial layers is attained when the growth interval substantially equals to the one half of the at least one cycle period of the reflected beam.

4. The method of claim 1, wherein said first epitaxial layer is a InAlGaAs layer and said second epitaxial layer is a InAlAs epitaxial layer.

* * * * *